(12) United States Patent
Antonelli et al.

(10) Patent No.: US 10,775,149 B1
(45) Date of Patent: Sep. 15, 2020

(54) LIGHT SOURCE FAILURE IDENTIFICATION IN AN OPTICAL METROLOGY DEVICE

(71) Applicant: ONTO INNOVATION INC., Wilmington, MA (US)

(72) Inventors: George Andrew Antonelli, Portland, OR (US); Troy Daniel Ribaudo, Portland, CA (US)

(73) Assignee: Onto Innovation Inc., Wilmington, MA (US)

( * ) Notice: Subject to any disclaimer, the term of this patent is extended or adjusted under 35 U.S.C. 154(b) by 0 days.

(21) Appl. No.: 16/352,724

(22) Filed: Mar. 13, 2019

Related U.S. Application Data

(60) Provisional application No. 62/642,889, filed on Mar. 14, 2018, provisional application No. 62/738,716, filed on Sep. 28, 2018.

(51) Int. Cl.
    *G01B 11/02*     (2006.01)
    *G01B 9/02*     (2006.01)

(52) U.S. Cl.
    CPC ..... *G01B 9/02075* (2013.01); *G01B 9/02002* (2013.01); *G01B 2210/56* (2013.01); *G01B 2290/25* (2013.01)

(58) Field of Classification Search
    CPC ............ G01B 9/02075; G01B 9/02002; G01B 2210/56; G01B 2290/25; G01J 9/0246; G01J 2009/0257; H01S 5/3401
See application file for complete search history.

(56) References Cited

U.S. PATENT DOCUMENTS

| | | |
|---|---|---|
| 4,461,718 A | 7/1984 | Kaye et al. |
| 5,042,951 A | 8/1991 | Gold et al. |
| 5,220,403 A | 6/1993 | Batchelder et al. |
| 5,589,689 A | 12/1996 | Koskinen |
| 5,652,673 A | 7/1997 | Oakberg |
| 6,480,277 B1 | 11/2002 | Nafie |
| 6,587,214 B1 | 7/2003 | Munks |
| 6,590,710 B2 | 7/2003 | Hara et al. |
| 7,092,589 B2 | 8/2006 | Kish, Jr. et al. |
| 7,283,694 B2 | 10/2007 | Welch et al. |

(Continued)

OTHER PUBLICATIONS

Funke, S. "Imaging Spectroscopic Ellipsometry of MoS2," J. Phys.: Condens. Matter 28 (2016) 385301.

(Continued)

*Primary Examiner* — Tarifur R Chowdhury
*Assistant Examiner* — Jonathon Cook
(74) *Attorney, Agent, or Firm* — Paradice and Li LLP

(57) ABSTRACT

An optical metrology device produces light in a spectral range for measurement of a sample using a tunable Quantum Cascade Laser (QCL). The optical metrology device includes a second channel that is used to diagnose when the tunable QCL is in failure mode, e.g., when it is not producing all wavelengths in the plurality of different wavelength ranges. The second channel includes at least one optical flat that is transmissive to the light produced by the QCL and is separate from the tunable QCL. The optical flat is switchably placed in a beam path of the light produced by the tunable QCL and light transmitted through the optical flat is received by a detector. Using output signals from the detector, a failure mode of the tunable QCL may be determined.

21 Claims, 5 Drawing Sheets

(56) References Cited

U.S. PATENT DOCUMENTS

| | | |
|---|---|---|
| 7,349,103 B1 | 3/2008 | Balooch et al. |
| 7,554,668 B2 | 6/2009 | Zhou et al. |
| 7,573,919 B2 | 8/2009 | Cattelan et al. |
| 7,671,989 B2 | 3/2010 | Liphardt et al. |
| 7,903,704 B2 | 3/2011 | Patel et al. |
| 9,404,872 B1 | 8/2016 | Wang et al. |
| 9,664,563 B2 | 5/2017 | Lucey |
| 2002/0093660 A1 | 7/2002 | Maeda |
| 2002/0094148 A1* | 7/2002 | McDaniel ............ G02B 6/4215 385/14 |
| 2003/0072336 A1 | 4/2003 | Senapati et al. |
| 2003/0142904 A1 | 7/2003 | Su |
| 2006/0256437 A1* | 11/2006 | Imaki ........................ G01J 9/02 359/489.19 |
| 2011/0135301 A1 | 6/2011 | Myslinski et al. |
| 2015/0270685 A1* | 9/2015 | Caneau ................... H01S 5/028 372/20 |
| 2017/0045443 A1* | 2/2017 | Wang ................. G01N 21/3504 |

OTHER PUBLICATIONS

Nelson, David D. "New Method for Isotopic Ratio Measurements of Atmospheric Carbon Dioxide Using a 4.3um Pulsed Quantum Cascade Laser," Aerodyne Research, Inc.
U.S. Appl. No. 16/352,716, filed Mar. 13, 2019.

* cited by examiner

LIGHT SOURCE FAILURE IDENTIFICATION IN AN OPTICAL METROLOGY DEVICE

CROSS REFERENCE TO RELATED APPLICATIONS

This application claims priority under 35 USC 119 to U.S. Provisional Application No. 62/642,889, entitled "A MID-INFRARED POLARIZATION MODULATION METROLOGY SYSTEM," filed Mar. 14, 2018, and U.S. Provisional Application No. 62/738,716, entitled "OPTICAL METROLOGY SYSTEM WITH BACK SIDE REFLECTION EXCLUSION," filed Sep. 28, 2018, both of which are incorporated herein by reference in their entireties.

FIELD OF THE INVENTION

The present invention is related to optical metrology with a light source that produces multiple wavelengths and, in particular, to the identification of a failure of the light source to produce one or more wavelengths of light.

BACKGROUND

Semiconductor and other similar industries, often use optical metrology equipment to provide non-contact evaluation of substrates during processing. With optical metrology, a sample under test is illuminated with light. After interacting with the sample, the resulting light is detected and analyzed to determine a desired characteristic of the sample.

Some optical metrology systems use multiple wavelengths of light, either simultaneously or sequentially, e.g., in multiple narrow bandwidths. Light sources that produce multiple wavelengths of light in optical metrology systems sometimes use a combination of multiple light sources, each producing a different range of wavelengths. If one or more of these multiple light sources malfunction, e.g., either fail to produce light or produce light with an incorrect wavelength, the resulting measurements generated by the optical metrology device may be adversely affected.

SUMMARY

An optical metrology device produces light in a spectral range for measurement of a sample using a tunable Quantum Cascade Laser (QCL). The optical metrology device includes a second channel that is used to diagnose when the tunable QCL is in failure mode, e.g., when it is not producing all wavelengths in the plurality of different wavelength ranges. The second channel includes at least one optical flat that is transmissive to the light produced by the QCL and is separate from the tunable QCL. The optical flat is switchably placed in a beam path of the light produced by the tunable QCL and light transmitted through the optical flat is received by a detector. Using output signals from the detector, a failure mode of the tunable QCL may be determined.

In one implementation, an optical metrology device capable of detecting failure of a light source includes the light source comprising a tunable Quantum Cascade Laser, wherein the tunable Quantum Cascade Laser nominally produces light in a plurality of different wavelength ranges; a first set of focusing optics that obliquely focuses the light into a measurement spot on a sample, wherein at least a portion of the light is reflected by the sample; a second set of focusing optics that receives the light reflected from the sample; a first detector that receives the light from the second set of focusing optics; an optical flat that is transmissive to the light produced by the tunable Quantum Cascade Laser and that is switchably placed in a beam path of the light produced by the tunable Quantum Cascade Laser, the optical flat being separate from the tunable Quantum Cascade Laser; a second detector that receives light transmitted through the optical flat; and at least one processor coupled to the first detector and the second detector, the at least one processor configured to, while the optical metrology device is in operating mode: determine a characteristic of the sample with output signals from the first detector in response to the light reflected from the sample; the at least one processor is further configured to, while the optical metrology device is in diagnostic mode: determine whether the tunable Quantum Cascade Laser is in a failure mode with output signal from the second detector, wherein while in failure mode the tunable Quantum Cascade Laser is not producing all wavelengths in the plurality of different wavelength ranges; and communicate signals that prevent operation of the optical metrology device and indicate the failure mode to a user when it is determined that the tunable Quantum Cascade Laser is in the failure mode.

In one implementation, a method of detecting failure of a light source in an optical metrology device includes placing the optical metrology device in an operating mode comprising: producing light with the light source comprising a tunable Quantum Cascade Laser, wherein the tunable Quantum Cascade Laser nominally produces light in a plurality of different wavelength ranges; focusing the light to be obliquely incident in a measurement spot on a sample, wherein at least a portion of the light is reflected off the sample; receiving the light reflected from the sample with a first detector; determining a characteristic of the sample with output signals from the first detector in response to the light reflected from the sample; placing the optical metrology device in a diagnostic mode comprising: switchably placing an optical flat that is transmissive to the light produced by the tunable Quantum Cascade Laser in a beam path of the light produced by the tunable Quantum Cascade Laser, the optical flat being separate from the tunable Quantum Cascade Laser; producing light with the plurality of different wavelength ranges with the tunable Quantum Cascade Laser; detecting light transmitted through the optical flat with a second detector; determining whether the tunable Quantum Cascade Laser is in a failure mode with output signals from the second detector, wherein while in failure mode the tunable Quantum Cascade Laser is not producing all wavelengths in the plurality of different wavelength ranges; and communicating signals preventing operation of the optical metrology device and indicating the failure mode to a user when it is determined that the tunable Quantum Cascade Laser is in the failure mode.

In one implementation, an optical metrology device capable of detecting failure of a light source, includes the light source comprising a tunable Quantum Cascade Laser, wherein the tunable Quantum Cascade Laser nominally produces light in a plurality of different wavelength ranges; a first measurement channel comprising: a first set of focusing optics that obliquely focuses the light into a measurement spot on a sample, wherein at least a portion of the light is reflected by the sample; a second set of focusing optics that receives the light reflected from the sample; a first detector that receives the light from the second set of focusing optics; a second measurement channel comprising: a plurality of optical flats that are transmissive to the light produced by the tunable Quantum Cascade Laser and that are switchably placed individually in a beam path of the light produced by the tunable Quantum Cascade Laser, the optical flats being separate from the tunable Quantum Cascade Laser, wherein each optical flat is sensitive to a different wavelength range; a second detector that receives light transmitted through the optical flat; and at least one processor coupled to the first detector and the second detector, the at least one processor configured to: while the optical metrology device is in operating mode: determine a characteristic of the sample with output signals from the first detector in response to the light reflected from the sample; while the optical metrology device is in diagnostic mode: determine whether the tunable Quantum Cascade Laser is in a failure mode with output signal from the second detector, wherein while in failure mode the tunable Quantum Cascade Laser is not producing all wavelengths in the plurality of different wavelength ranges; and communicate signals that prevent operation of the optical metrology device and indicate the failure mode to a user when it is determined that the tunable Quantum Cascade Laser is in the failure mode.

DETAILED DESCRIPTION

Figure 1:
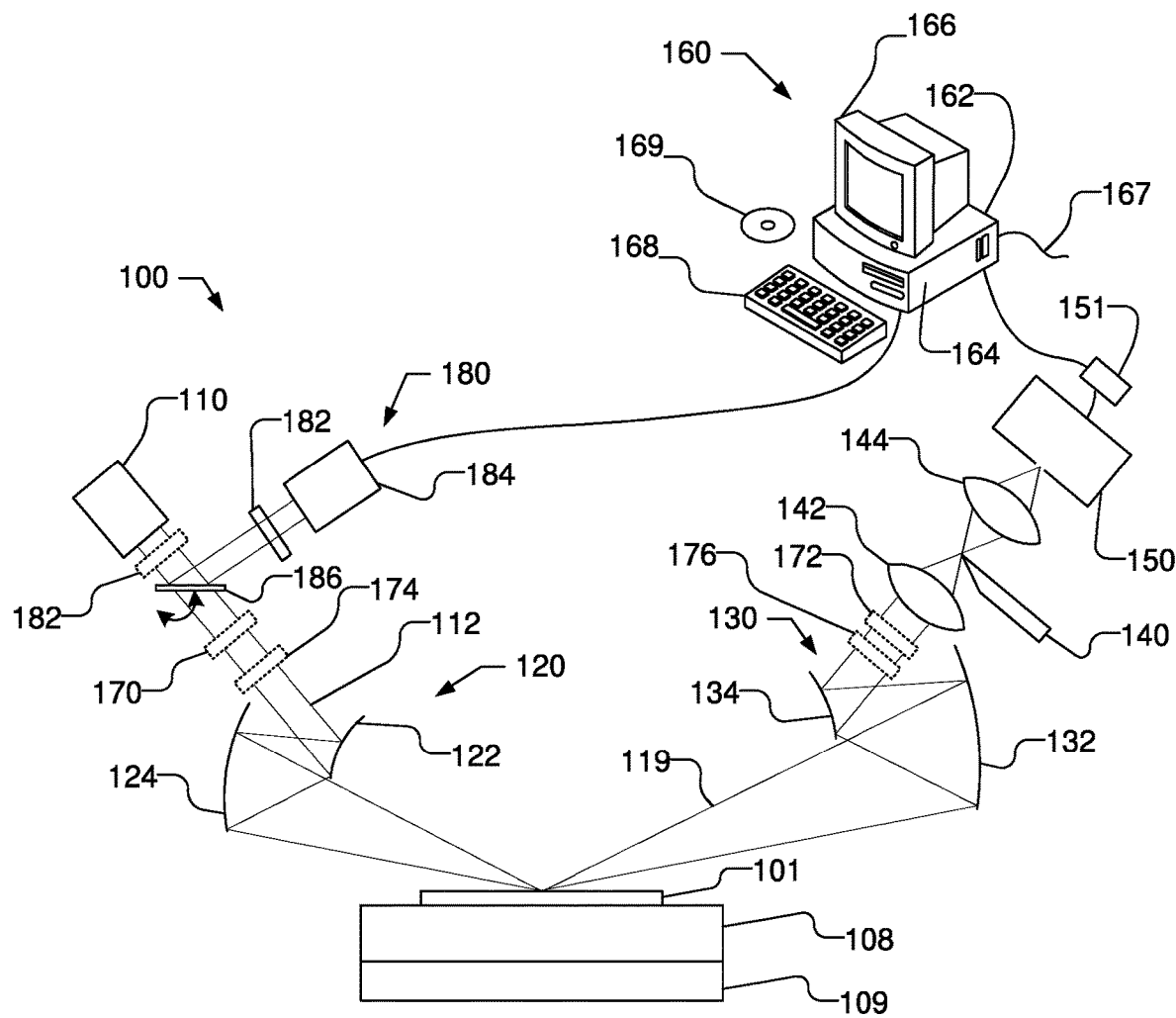
FIG. 1 illustrates a schematic view of an optical metrology device configured to perform measurements of a sample that is at least partially transparent to the spectral range of light used by the optical metrology device and includes an additional measurement channel to monitor failure modes of the light source.

FIG. 1 illustrates a schematic view of an optical metrology device 100 that includes a light source 110 that produces a plurality of different wavelengths and includes an additional measurement channel to monitor failure modes of the light source 110. The optical metrology device 100 may be configured to perform reflectometric, ellipsometric, including Muller matrix ellipsometric, measurements of a sample 101.

The optical metrology device 100, for example, may be a Mid-Infrared Polarization Modulation Metrology System (MPMMS), in which the light source 110 is configured to produce light 112, e.g., in the mid-infrared spectral region. For example, light source 110 may be a tunable Quantum Cascade Laser (QCL), which produces infrared light having wavelengths between 2.4 µm and 30 µm, or more particularly between 5 µm and 13 µm, or other desired ranges. In one implementation, the QCL light source 110 may be the type purchased from Block Engineering, LLC, DRS Daylight Solutions, or Pranalytica. The light source 110 may be tunable to sequentially produce light with different wavelengths in a desired spectral range. By way of example, the light source 110 may be a coherent, broadly tunable laser based emitter that provides a suitable average power, e.g., greater than 1 mW at the sample, and more particularly 10-100 mW, for signal to noise (SNR) considerations.

The use of the infrared or mid-infrared spectral region may be advantageous to measure certain types of samples, e.g., with many stacked layers. While silicon is transparent in the mid-infrared spectral region, the optical metrology device 100 may be configured to measure a silicon sample using an infrared or mid-infrared spectral region, e.g., by eliminating the back side reflections caused by the incident light passing through the sample 101 and reflecting off the bottom surface of the sample 101 or the chuck 108 supporting the sample 101. Additionally, the optical metrology device 100 may use a one or more photoelastic modulators (PEM) to modulate the polarization at the detector, before, after or both before and after reflecting off the sample.

The measurements of the sample 101 produced by the optical metrology device 100 rely on the light source 110 accurately producing the intended wavelengths of light. Failure to accurately produce some of the wavelengths may result in an inaccurate measurement of the sample. Moreover, the light source 110 may not provide an indication that it is not accurately producing intended wavelengths. For example, a QCL light source typically includes multiple separate light sources, such as individual external cavity quantum cascade lasers (ECQCLs), each producing a different range of wavelengths. One of the sub-light sources may fail to produce light or may inaccurately produce the desired wavelengths of light, while the other sub-light sources operate as intended.

Accordingly, optical metrology device 100 includes an additional measurement channel 180 to enable both wavelength and power monitoring of the light source that does not impact the main measurement capabilities of the optical metrology device 100. Thus, the optical metrology device 100 may include a first measurement channel that includes at least, e.g., focusing optics 120, including optical elements 122 and 124, and a detector 150, and a second measurement channel 180 for diagnosing a failure mode of the light source 110. The additional measurement channel 180, for example, includes an optical flat 182, such as a Fabry Perot etalon, that is switchably placed in the beam path of the light 112, e.g., by a flip mirror 186 or by other appropriate techniques. The optical flat 182 is transmissive to the light produced by the light source 110 and is separate from, e.g., outside, the light source 110. Light is transmitted through the optical flat 182 and is received by a detector 184, which produces output signals to a processor 160, which can determine whether the light source 110 is in a failure mode, e.g., if the light source 110 is not producing all desired wavelengths of light. If the light source 110 is in failure mode, signals from the processor 160 are communicated to prevent operation of the optical metrology device 110 and to indicate the failure mode to a user so that corrective measurements may be made.

The optical metrology device 100 includes focusing optics 120 to obliquely focus the light 112 on a top surface of the sample 101. The focusing optics 120 may be refractive, reflective, or a combination thereof. FIG. 1 illustrates reflective optical elements 122 and 124 as focusing the light 112 to be obliquely incident on the sample 101. Reflective optical elements 122 and 124 may have a bare or protected Gold or Aluminum coating on a metal or glass substrate. The reflective optical elements 122 and 124 may include Schwarzschild objective, spherical, elliptical, off-axis parabolic mirrors or combinations thereof. Moreover, additional or fewer reflective optical elements may be used for the focusing optics 120. If desired, refractive optics may be additionally or alternatively used in the focusing optics 120. Refractive optics may be made of a materials including, but not limited to, Zinc Selenide, Silicon, Germanium, Magnesium Fluoride, Barium Fluoride, or Calcium Fluoride.

The reflected light 119 from the sample 101 is received by another set of focusing optics 130. As with focusing optics 120, the focusing optics 130 receiving the reflected light 119 may be refractive, reflective, or a combination thereof. For example, focusing optics 130 are illustrated as including reflective optical elements 132 and 134 to receive the reflected light 119. The reflective optical elements 132 and 134 may have a bare or protected Gold or Aluminum coating on a metal or glass substrate. The reflective optical elements 132 and 134 may include Schwarzschild objective, spherical, elliptical, off-axis parabolic mirrors or combinations thereof. Moreover, additional or fewer reflective optical elements may be used for the focusing optics 130. If desired, refractive optics may be additionally or alternatively used in the focusing optics 130. Refractive optics may be made of a materials including, but not limited to, Zinc Selenide, Silicon, Germanium, Magnesium Fluoride, Barium Fluoride, or Calcium Fluoride.

A detector 150 receives the reflected light 119. The detector 150 may include one or more single pixel photodetector elements, e.g., a monolithic chip with a single pixel that is sensitive to infrared light. The size of the detector element may be selected to be consistent with the beam size at the plane of the detector element. The detector 150 should be matched to the output range of the light source 110. For example, a charge-coupled device (CCD) type or complementary metal-oxide-semiconductors (CMOS) type detectors are typically manufactured with silicon, and are thus not appropriate for detecting infrared wavelengths. A variety of materials and detector configurations are appropriate for specific ranges within the infrared. For example, a thermoelectrically cooled (TEC) Mercury Cadmium Telluride (MCT) detector may be used with a light source that produces a wavelengths in a mid-infrared spectral region, e.g., approximately 5 µm to 13 µm. A liquid nitrogen cooled MCT detector may be used for low signal levels, or Deuterated-Triglycine Sulfate based elements (DTGS) for applications with high reflection values and potential MCT detector saturation. In embodiments where the wavelength range is approximately 2 µm to 5 µm, Lead Selenide (PbSe), Indium Antimonide (InSb), or Indium Gallium Arsenide (InGaAs) based detectors may be used for enhanced detectivity. The signal output from the detector 150 may be pre-amplified with a transimpedance amplifier 151.

It should be understood that there may be additional optical elements in the beam path of the optical metrology device 100. For example, the optical system may include additional optical elements in the beam path after the light source 110 to expand the light 112 to allow the focusing optics 120 to achieve a desired optical spot size on the sample 101. Moreover, the optical system may include additional optical elements in the beam path before the detector 150, such as a beam expansion or reduction system, to alter the size of the beam, e.g., to make it commensurate with the detector element size. The beam expansion or reduction systems may include one or more refractive optics that may be manufactured from, e.g., bare or protected Gold or Aluminum coating on a metal or glass substrate and/or reflective optics, that may be manufactured from, e.g., Zinc Selenide, Silicon, Germanium, Magnesium Fluoride, Barium Fluoride, or Calcium Fluoride.

Additionally, one or more polarizing elements may be in the beam path of the optical metrology device 100. For example, as illustrated with dotted lines, optical metrology device 100 may include one or both (or none) of a polarizing element 170 in the beam path before the sample 101 and a polarizing element (analyzer) 172 in the beam path after the sample 101. For example, Zinc Selenide wire grid polarizers may be used to control the input polarization state as well as the final state of the beam before it excites the detecting element in detector 150. If the optical metrology device 100 uses a polarizing element, e.g., as part of an ellipsometric measurement system, accurate operation is dependent on the polarization controlling component. For example, a high extinction ratio, e.g., greater than 1000 to 1, and transmission efficiency of the polarization controlling components is desirable for measurement accuracy and signal to noise ratio (SNR).

In addition, the optical metrology device 100 may include one or more photoelastic modulators (PEMs) in the beam path. For example, as illustrated with dotted lines, optical metrology device 100 may include one or both (or none) of a PEM 174 in the beam path before the sample 101, and a PEM 176 in the beam path after the sample 101. The function of the PEM 174, for example, is to generate a time dependent polarization to the light beam at the detector 150, either before or after reflecting off the sample 101, or both before and after reflecting off the sample 101, depending on the geometry. The time dependent nature is such that the beam oscillates between linearly polarized and circularly polarized states with a known frequency, e.g., on the order of 50 kHz. Where one or more PEMs 174 and 176 are used, the time response of the detector 150 should be sufficient to respond to the modulation rate of the PEMs. The transimpedance amplifier 151 that pre-amplifies the signal output from the detector 150 may have a bandwidth that is at least twice the modulation frequency of the PEM, e.g., and may be 200 kHz or greater.

The one or more PEMS 174, 176 may be adjusted such that each wavelength of light that is sequentially produced by the tunable light source 110 has the same retardation of polarization at each wavelength. For example, the voltage applied to the PEMs 174 and/or 176 may be set to a specific value for each different wavelength produced by the light source 110 to achieve the same retardation. Thus, with a wavelength variable light source 110, such as a tunable QCL, the desired retardation and wavelength are inputs used to set the voltage applied to the transducers in the body of the PEM. The general scheme, therefore, requires that the wavelength of the light source 110, e.g., the tunable QCL, be tuned and the voltage on the PEM 174 and/or 176 be adjusted simultaneously to create the same retardation, such as quarter wavelength, across the spectral range of the light source 110, i.e., sequential not parallel operation. The sequential operation of the system may be dictated by the tunable nature of the light source 110. The desired retardation and wavelength are inputs used to set the voltage applied to the transducers in the body of the PEM. The calibration of the voltage applied to the transducers in the body of the PEM may be performed by measuring transmission through the entire optical system with specific polarizer and modulator orientations. If two PEMs 174 and 176 are used, the modulation frequencies may differ by a few kHz or more. The body of the PEMs used in the optical metrology device 100 may be, e.g., Zinc Selenide.

If desired, a rotating compensator may be used for retardation instead of a PEM. A rotating compensator operates at a much lower frequency compared to PEMs (<1 kHz vs 50 kHz) and therefore may reduce throughput compared to use of PEMs. However, multiple wavelengths may be simultaneously retarded with a rotating compensator. This feature could be used to multiplex the system provided the QCL light source is capable of producing multiple wavelengths simultaneously and a diffraction grating is used to separate the wavelengths and either multiple detectors or a detector array is used in place of detector 150 to receive the separate wavelengths. The additional measurement channel 180 may be used to enable monitoring multiple wavelengths individually, or simultaneously if a diffraction grating is used to separate the wavelengths and multiple optical flats 182 and either multiple detectors or a detector array in place of detector 184 are used to receive and monitor the separate wavelengths. In some implementations, a diffraction grating is not used and a single optical flat 182 and detector 184 may receive the light as a superposition of the wavelengths.

Additionally, because the light source 110 produces light in the mid-infrared spectral range which is transparent to silicon, the sample 101 may be at least partially transparent to the light produced by the light source 110. Accordingly, it may be desirable to separate reflection from the back side of the sample 101 (or the underlying chuck 108) from reflection from the front side of the sample 101. One way to exclude the back side reflection may be a knife edge 140 that blocks the back side reflection while allowing the front side reflection to pass. The knife edge 140 is located at a point in the optical system of the optical metrology device 100 where the front side reflection and the back side reflection may be isolated from each other. For example, as illustrated, a knife edge 140 may be disposed between the sample 101 and the detector 150, e.g., between the receiving focusing optics 130 and a detector 150 or between a polarizer (analyzer) if used and the detector 150. As illustrated, the knife edge 140 may be between lenses 142 and 144 and is located at the focal plane of the lens 142, which images the front side reflection and the back side reflection. The knife edge 140 blocks the back side reflection, i.e., the reflected light from the bottom surface of the sample 101. The lens 144 thus receives the front side reflection, but not the back side reflection, and provides the front side reflection to the detector 150. Accordingly, the back side reflection is not received by the detector 150.

If desired, the back side reflection in the reflected light 119 may be excluded from being received by the detector 150 in other manners. For example, the detector 150 itself may be used to physically exclude the detection of the back side reflection, e.g., by locating an entrance pupil of the detector 150 so that the back side reflection is blocked by the side of the entrance pupil. Alternatively, both the front side reflection and the back side reflection may pass through the entrance pupil of the detector 150, but the detector 150 may be positioned so that only the front side reflection is received by the single pixel photodetector element.

The detector 150 generates a plurality of output signals from the detected light that is received by the processor 160. The output signals are indicative of a response of the sample 101 to the obliquely incident light on the sample 101. Using the output signals, a characteristic of the sample may be determined. By way of example, the output signals from the detector 150 may be monitored to extract the DC value, as well as the 1st and 2nd harmonic at the PEM modulation frequency in the case of a single PEM modulator, and the sum and difference frequencies of the two modulators, as well as the twice the sum and difference frequencies in the case of two PEM modulators. The non-zero frequency signals may be monitored through a digital or analog lock-in-amplification (LIA) process with transimpedance amplifier 151. If desired, a mechanical optical chopper in the beam path allows the measurement of the DC signal to be made by LIA as well. If no mechanical chopper is used, a digital multimeter and appropriate signal isolation and digital or analog low-pass filters may be used. The time constant of the lock-in implication scheme will be set by the signal to noise ratio of the system. For a multi-modulator system, additional demodulators within the LIA may be used. The frequency range of the operation of the PEMs 174 and 176 makes the use of a Field-Programmable Gate Array (FPGA) a good approach for simplifying the instrumentation of the transimpedance amplifier 151 and enabling a direct manner of scaling system complexity without increasing hardware.

The detector 150 may be coupled to at least one processor 160, such as a workstation, a personal processor, central processing unit or other adequate processor system, or multiple systems. It should be understood that one processor, multiple separate processors or multiple linked processors may be used, all of which may interchangeably be referred to herein as processor 160, at least one processor 160, one or more processors 160. The processor 160 is preferably included in, or is connected to or otherwise associated with optical metrology device 100. The processor 160, for example, may control the positioning of the sample 101, e.g., by controlling movement of a stage 109 that is coupled to the chuck. The stage 109, for example, may be capable of horizontal motion in either Cartesian (i.e., X and Y) coordinates, or Polar (i.e., R and θ) coordinates or some combination of the two. The stage may also be capable of vertical motion along the Z coordinate. The processor 160 may further control the operation of the chuck 108 to hold or release the sample 101. The processor 160 may collect and analyze the data obtained from the detector 184 in the separate measurement channel 180 to determine if the light source 110 is in a failure mode and may communicate a signal to prevent operation of the optical metrology device 110 and to indicate the failure mode to a user so that corrective measures may be made, as discussed herein.

The processor 160 may also collect and analyze the data obtained from the detector 150, assuming the light source 110 is not in a failure mode, to determine one or more physical characteristics of the sample 101. For example, the processor 160 may analyze the data to determine one or more physical characteristics of the sample 101 as discussed below. For example, the raw output of the optical metrology device 100 is a spectra of voltage values versus wavelength set point on, e.g., light source 110. In the case of use of a single PEM 174 or 176, the voltage values are recorded from LIA and are referred to as the DC (chopper frequency), 1F (PEM frequency), and 2F (second harmonic of the PEM frequency) signals. The LIA measure the root mean squared voltage, the chopper halves all signals, and the chopper is a square wave. The measured voltage from the lock in amplifier for DC amplification is multiplied by correction factor, e.g., π/4, because the DC signal is a square wave and the lock-in only extracts the first component. Hence, two to three demodulations may be used depending on whether an optical chopper is present. Depending on the orientation of the optical axis of the polarizing components, the spectra may be used to calculate ellipsometric values N, C and S. If one takes the plane of incidence to be the 0-degree angle direction with rotation clock wise while observing the sample from the source direction being positive, the simplest embodiment of the calculation for the configuration of first polarizer at 45°, PEM at 0°, and analyzing polarizer at +45° is:

$$S = 1F/2/J1/DC \qquad \text{eq. 1}$$

$$C = 2F/2/J2/DC \qquad \text{eq. 2}$$

$$N = \sqrt{1-S^2-C^2} \qquad \text{eq. 3}$$

where J1 and J2 are the Bessel functions of the first kind, such that J1=J1(A), and J2=J2(A), where A=2.4048 rad. A plurality of output signals may be generated in this manner, wherein the output signals are indicative of a response of the sample to the light that is obliquely incident on the sample, from which the desired characteristic of the sample may be determined.

The processor 160, which includes at least one processing unit 162 with memory 164, as well as a user interface including e.g., a display 166 and input devices 168. A non-transitory processor-usable storage medium 169 having processor-readable program code embodied may be used by the processor 160 for causing the at least one processor to control the optical metrology device 100 and to perform the functions including the analysis described herein. The data structures and software code for automatically implementing one or more acts described in this detailed description can be implemented by one of ordinary skill in the art in light of the present disclosure and stored, e.g., on a processor-usable storage medium 169, which may be any device or medium that can store code and/or data for use by a processor system such as processing unit 162. The processor-usable storage medium 169 may be, but is not limited to, magnetic and optical storage devices such as disk drives, magnetic tape, compact discs, and DVDs (digital versatile discs or digital video discs). A communication port 167 may also be used to receive instructions that are used to program the processor 160 to perform any one or more of the functions described herein and may represent any type of communication connection, such as to the internet or any other processor network. The communication port 167 may further export signals, e.g., with measurement results and/or instructions, to another system, as well as to components of the optical metrology device 100 to prevent operation of the optical metrology device 100 if the light source 110 is determined to be in a failure mode and to communicate with a user, e.g., via an warning system, which may be visual or auditory, to inform the user of the failure. Additionally, the functions described herein may be embodied in whole or in part within the circuitry of an application specific integrated circuit (ASIC) or a programmable logic device (PLD), and the functions may be embodied in a processor understandable descriptor language which may be used to create an ASIC or PLD that operates as herein described.

Figure 2:
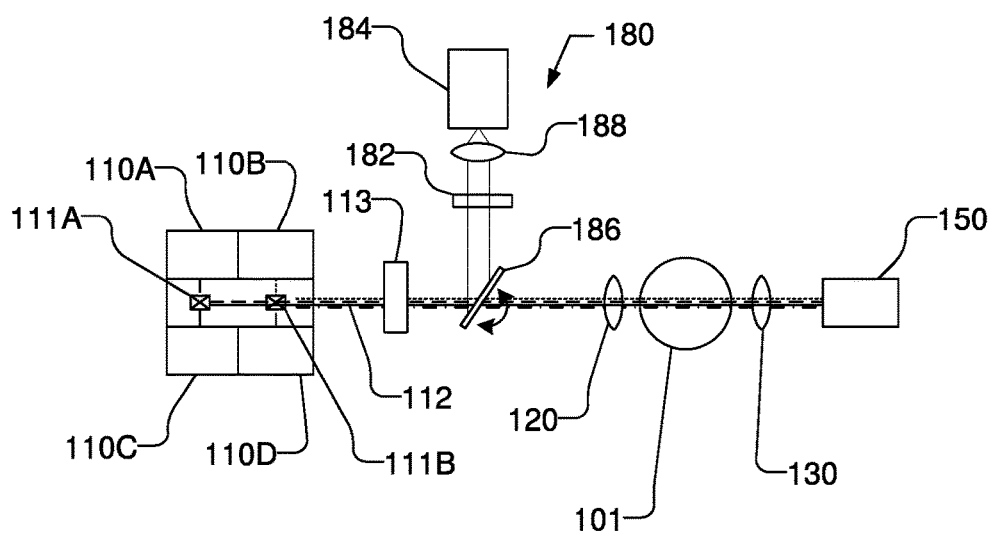
FIG. 2 illustrates a simplified top plan view of the optical metrology device with the additional measurement channel to monitor failure modes of the light source.

FIG. 2 illustrates a simplified top plan view of the optical metrology device 100 with the additional measurement channel 180 to monitor failure modes of the light source 110. Light source 110 includes a number of sub-light sources 110A, 110B, 110C, and 110D. The light produced by the sub-light sources 110A, 110B, 110C, and 110D are combined by various mirrors or beam splitters 111A and 111B and exit the light source 110 as a single beam 112. By way of example, the light source 110 is a QCL light source that includes a number, e.g., four, individual external cavity quantum cascade lasers (ECQCLs) contained within one light source package. Typically, an ECQCL is formed with a front side collimating lens, the QCL bar itself, a rear side collimating lens, and a rotating diffraction grating. The QCL bars possess broad gain spectrums, and by rotating the grating angle appropriately, a specific wavelength will couple into a retroreflected mode allowing for population inversion and lasing at the specific wavelength. The ECQ-CLs may include additional internal components, such as reference detectors to tune or calibrate the wavelengths produced by rotating the grating of each ECQLC. Multiple ECQCLs are combined together into a single light source package to expand the range of wavelengths that may be emitted. If desired, the light sources other than a tunable QCL may be used light source 110.

During operation, within optical metrology device 100, however, QCL light source 110 may enter an error or failure mode, where one or more of the sub-light sources 110 fails to produce light or produces light having a wavelength that differs from the desired wavelength. For example, the grating may fail to rotate on command resulting in no or improper wavelength tuning. Further, wavelength drift may occur over time.

The additional measurement channel 180 enables an external monitoring of the light source 110 to determine whether the light source 110 is in failure mode. The flip mirror 186 may be moved into the beam path of the light 112 to direct the light 112 from the light source 110 to the measurement channel 180, and may move out of the beam path of light 112 to direct light 112 to the sample 101 and detector 150, via focusing optics 120 and 130, or vice versa. If desired, other means of directing the light 112 to the measurement channel 180. For example, a beam splitter may be used, but this may reduce the intensity of the light 112 used to measure the sample 101. Further, the location of the measurement channel 180 may differ if desired. For example, the measurement channel 180 may be located after the sample 101, e.g., between the sample 101 and the detector 150, but the interaction of the light 112 with the sample 101 may adversely affect the measurements performed by measurement channel 180.

Figure 3:
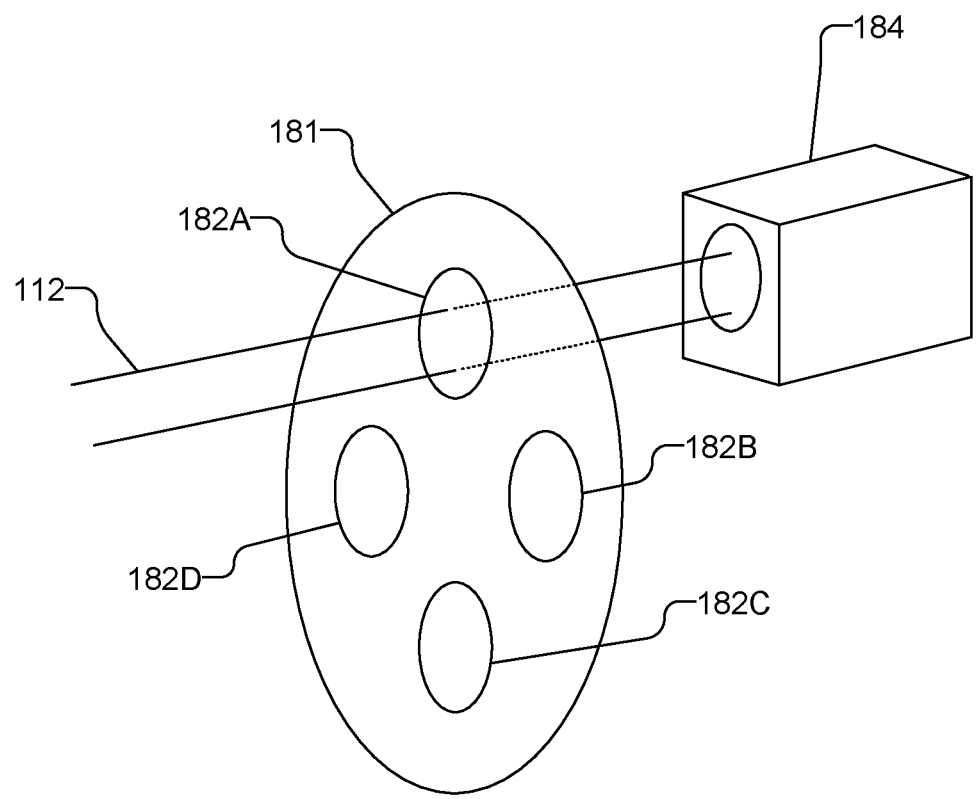
FIG. 3 illustrates a perspective view of a number of optical flats in a rotating turret.

The optical flat 182, which may be a Fabry Perot etalon or other similar optical component monitors the wavelengths in the beam 112 through self-interference. The optical flat 182 may be, e.g., a double side polished silicon wafer that is approximately 1 mm thick. If desired, multiple optical flats, each configured to be sensitive to a different wavelength or wavelength range may be used, and selectively placed in the beam path within the additional measurement channel 180. FIG. 3, by way of example, illustrates a perspective view of a number of optical flats 182a, 182b, 182c, and 182d in a rotating turret 181 and detector 184. The rotating turret 181 may place the appropriate optical flat 182 in the beam path of the light 112 to monitor the desired wavelength. By way of example, each individual optical flat 182A, 182B, 182C, and 182D may be configured to measure one or more wavelengths, e.g., the center region of the range of wavelengths, produced by one of the sub-light sources 110A, 110B, 110C, and 110D, which may be used to determine if each sub-light source is operating and if the specific region tested is producing the desired wavelengths. If desired, additional optical flats may be present and used to monitor different regions of the range of wavelengths produced by each of the sub-light sources 110A, 110B, 110C, and 110D.

The light transmitted through the optical flat 182 may be collected and focused with one or more lenses 188, which may be refractive, reflective, or a combination thereof. By way of example, the lens 188 may be a 50-mm zinc selenide (ZnSe) lens. The resulting light is received by detector 184. Similar to detector 150, the detector 184 in the additional measurement channel 180 may be a single pixel photodetector elements, e.g., a monolithic chip with a single pixel that is sensitive to infrared light. The detector 184, like detector 150 may be matched to the output range of the light source 110. For example, a thermo-electrically cooled (TEC) or liquid nitrogen cooled MCT detector may be used. Other detectors may be used, such as DTGS detector, PbSe, InSb, or InGaAs based detectors, if desired.

The additional measurement channel 180 may be located after an optional optical chopper 113, so that the detector signal can be processed with a system lock in amplifier. The chopped signal is proportional to the measured intensity. The optical chopper 113, however, is not required. For a pulsed light source, the repetition rate of the light source 110 may be monitored with the lock in amplifier. The intensity may also be directly measured through the DC component of the detector signal from detector 184; however, in this case a blocking capacitor that is commonly found in most MCT detector pre-amplifiers may be removed, and a series of digital filters may be used to minimize the impact of a variety of noise sources.

The wavelength monitoring system relies on the self-interference phenomenon which occurs as a light beam passes through a flat optical component, such as a Fabry Perot etalon, and is partially reflected and transmitted at each interface. The separated beam components traverse a different distance within the optical flat and acquire a variation in relative phase. At the point of detection, the phase difference will produce an oscillation in the measured intensity versus wavelength which is dependent upon the material properties, slab thickness, and angle of incidence. Therefore, the hardware component and a simple theoretical model can be combined to validate assigned laser wavelength and any drift from that assignment over time.

A transfer matrix formalism may be used to produce a mathematical model to compare to measurements. In the transfer matrix method, one describes an optical system as an input port, a sequence of interfaces and layers each having a transfer matrix representing their reflection and transmission efficiencies, and an output port. With energy incident from only one direction, the product of all the matrices can be used to calculate the total system's transmission and reflection efficiencies while accounting for phase based interference effects. Derivations of the transfer matrix method have been widely published, and the case considered here is a simple example. For the transfer matrix analysis, one may first, describe the electric fields of forward and reverse propagating optical beams in vector form, second, equate the fields at either side of an interface using matrix terms derived from the Fresnel coefficients, and third, generate a matrix describing the phase impact from traversing a length of dielectric material.

Figure 4:
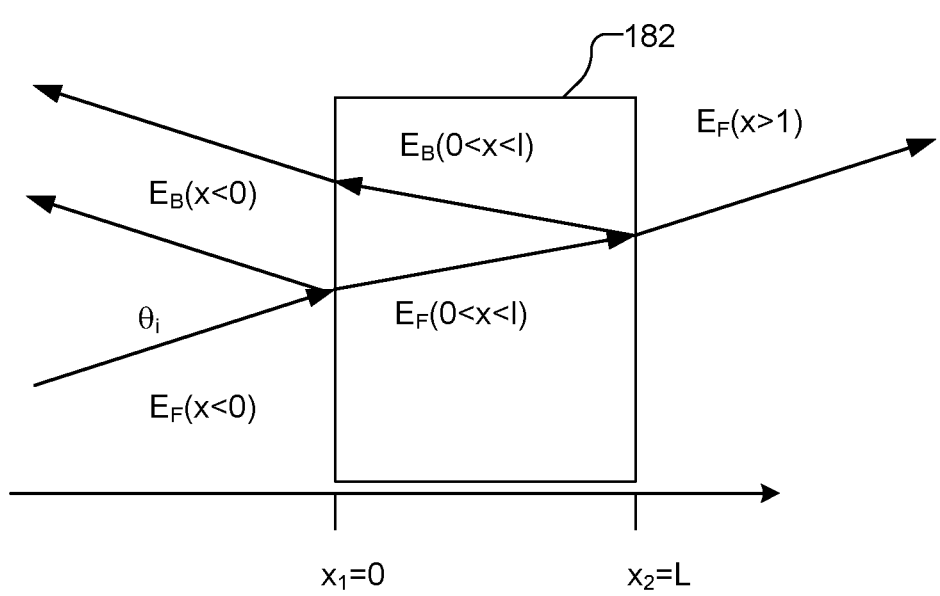
FIG. 4 is a schematic illustration of an optical flat for a transfer matrix analysis.

FIG. 4 is a schematic illustration of an optical flat, assumed to be a silicon slab, for a transfer matrix analysis. In this example, we consider a plane wave incident on a semi-infinite plate of refractive index n and thickness l, immersed in air.

The required matrices for this system are written as:

$$T_{12} = \frac{1}{t_{12}}\begin{bmatrix} 1 & r_{12} \\ r_{12} & 1 \end{bmatrix} = \frac{1}{t_{12}}\begin{bmatrix} 1 & r \\ r & 1 \end{bmatrix} \qquad \text{eq. 4}$$

$$T_2 = \begin{bmatrix} e^{i\delta} & 0 \\ 0 & e^{-i\delta} \end{bmatrix} \qquad \text{eq. 5}$$

$$T_{23} = \frac{1}{t_{23}}\begin{bmatrix} 1 & r_{23} \\ r_{23} & 1 \end{bmatrix} = \frac{1}{t_{23}}\begin{bmatrix} 1 & -r \\ -r & 1 \end{bmatrix} \qquad \text{eq. 6}$$

where the $t_{ij}$ and $r_{ij}$ are the fresnell coefficients, $r=r_{12}=-r_{23}$ due to symmetry, and $\delta = 2\pi/\lambda n l \cos(\theta)$.

The total system behavior can then be expressed as $$\begin{bmatrix} E_F(x<0) \\ E_B(x<0) \end{bmatrix} = T_{13} \begin{bmatrix} E_F(x>l) \\ 0 \end{bmatrix} \qquad \text{eq. 7}$$

where, $$T_{13} = T_{12}T_2T_{23}\frac{1}{t_{12}t_{23}}e^{i\delta}\begin{bmatrix} 1-r^2e^{-i2\delta} & -r(1-e^{-i2\delta}) \\ r(1-e^{-i2\delta})r^2 + r^2e^{-i2\delta} \end{bmatrix}. \qquad \text{ea. 8}$$

Depending on the polarization state considered, the appropriate Fresnell coefficients are chosen and the product of the matrices produces two equations with the two unknowns, $E_B(x<0)$ and $E_F(x<0)$, the reflected and transmitted electric fields respectively.

The effective reflection and transmission field amplitudes are then the ratios of these to the input field $E_F(x<0)$, namely, $$r = \frac{E_B(x<0)}{E_F(x<0)} = \frac{r(1-e^{-i2\delta})}{1-r^2e^{-i2\delta}} \qquad \text{eq. 9}$$

$$t = \frac{E_F(x>l)}{E_F(x<0)} = \frac{t_{12}t_{23}e^{-i\delta}}{1-r^2e^{-i2\delta}}. \qquad \text{eq. 10}$$

From the field efficiency coefficients, the power reflection and transmission coefficients are calculated as $$R = |r|^2 = \frac{4r^2\sin^2\delta}{(1-r^2)^2 + 4r^2\sin^2\delta} \qquad \text{eq. 11}$$

$$T = |t|^2 = \frac{|t_{12}t_{23}|^2}{(1-r^2)^2 + 4r^2\sin^2\delta}, \qquad \text{eq. 12}$$

where in the case of TE polarization $$r_{ij} = \frac{n_i\cos\theta_i - n_j\cos\theta_j}{n_i\cos\theta_i + n_j\cos\theta_j} \qquad \text{eq. 13}$$

$$t_{ij} = 1 + r_{ij} = \frac{2n_i\cos\theta_i}{n_i\cos\theta_i + n_j\cos\theta_j} \qquad \text{eq. 14}$$

and for TM $$r_{ij} = \frac{n_j\cos\theta_i - n_i\cos\theta_j}{n_j\cos\theta_i + n_i\cos\theta_j} \qquad \text{eq. 15}$$

$$t_{ij} = \frac{n_i}{n_j}(1 + r_{ij}) = \frac{2n_i\cos\theta_i}{n_j\cos\theta_j + n_i\cos\theta_j}. \qquad \text{eq. 16}$$

For the case of normal incidence the power efficiencies reduce to equivalent values.

Figure 5:
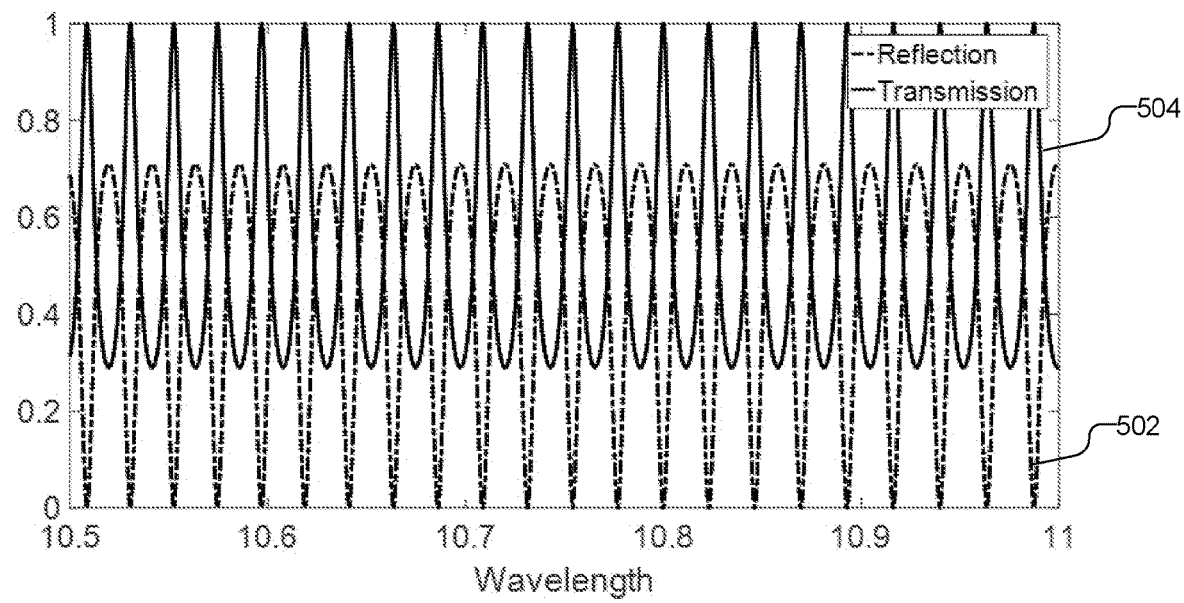
FIG. 5 illustrates the curves resulting from a transfer matrix analysis of an optical flat.

FIG. 5 illustrates the results of calculations for wavelengths of 10.5-11 µm passing through a 750 µm silicon optical flat at normal incidence with reflection illustrated with a dotted curve 502 and transmission illustrated with a solid curve 504.

Figure 6:
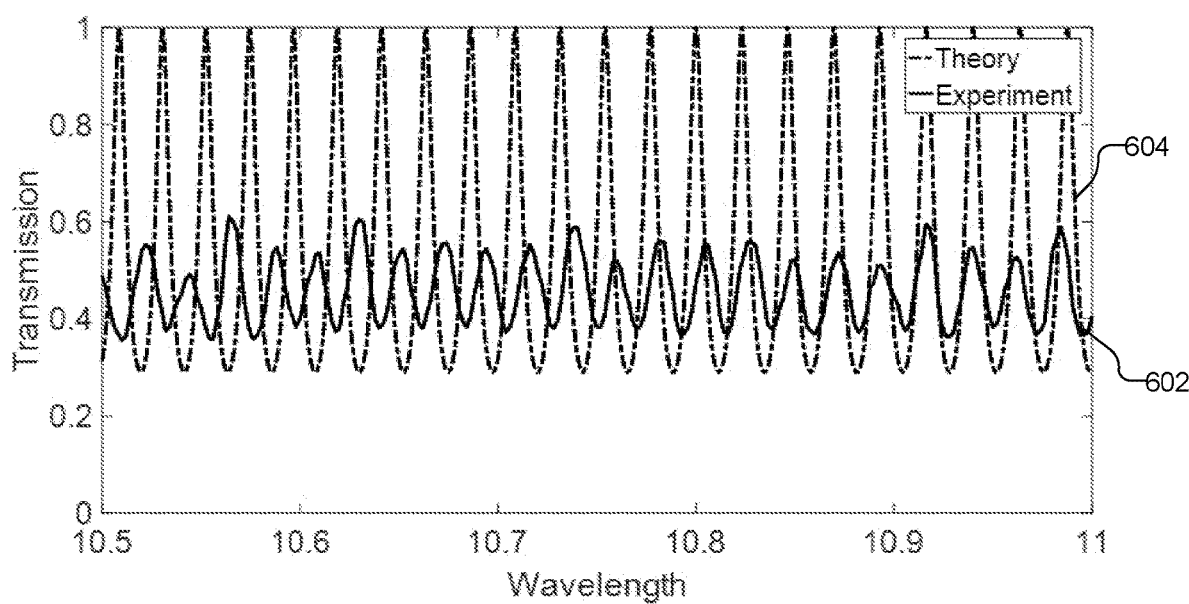
FIG. 6 illustrates a comparison of a curve resulting from measurement of light transmitted through an optical flat and a curve calculated from a transfer matrix analysis of the optical flat.

FIG. 6 is similar to FIG. 5 and illustrates with a solid curve 602 the experimental result of a background corrected transmission measurement for wavelengths of 10.5-11 µm passing through a 750 µm silicon optical flat at normal incidence, while the dotted curve 604 illustrates the predicted transmission. As can be seen, the amplitude of the curves 602 and 604 are significantly different, but the spectral positions and spacing of the maxima are in good agreement through most of the explored range. The difference in amplitudes may be a consequence of non-idealities in the experimental configuration; for example, the angle of incidence may be slightly different from normal, the laser beam may be non-gaussian in shape and the overlap of the backside reflection may not be exactly coincident with the front side reflection, the slab thickness varies across the beam image, etc.

Despite the disagreement in amplitudes in curves 602 and 604, the stability of the physical measurement is dependent upon the relative orientation of the optical flat and the incident beam, both of which are highly controllable. The hardware components in the additional measurement channel 180, such as the optical flat 182 would be stable. Thus, comparison of the measured data, illustrated by curve 604, to the calculated data, illustrated by curve 602 may be used to determine if a failure of the light source 110 has occurred. For example, changes in a difference between the measured data and the calculated data may be used to identify failure, e.g., an initial difference may be generated using initial data, and later measured data may be used to determine a subsequent difference, and if the variation between the initial difference and the subsequent difference exceeds a predetermined maximum threshold, the light source 110 may be considered to be in a failure mode.

Additionally or alternatively, instead of using a theoretical model, an initial data set may be generated using the optical flat or optical flats, and later measured signals may be compared to the initial data to determine if a variation has occurred, which may be used to identify a failure of the light source, e.g., if the variation is greater than a predetermined maximum threshold. Accordingly, any variation in the additional measurement channel 180 from an initial calibration curve would clearly demonstrate a change in the light source 110. Thus, an initial calibration curve may be generated using the optical flat 182 which may be compared to later measured curves to determine if the light source 110 is in failure mode. For example, if the differences between the measured curve and the calibration curve, e.g., as determined by the mean square error, exceeds a predetermined maximum threshold, the light source 110 may be considered to be in a failure mode.

Figure 7:
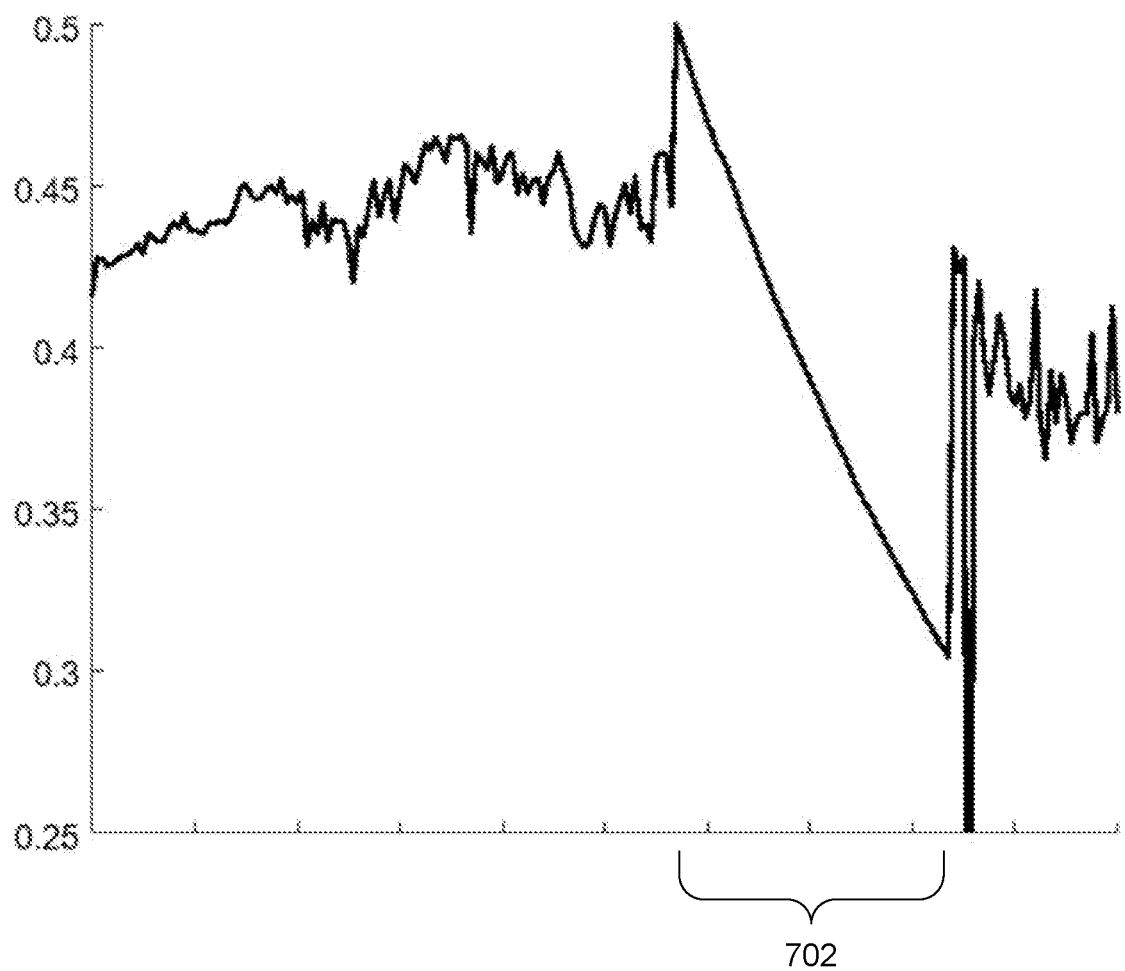
FIG. 7 is an illustration of a scan of a sample with an optical metrology device with a light source that is malfunctioning.

Furthermore, a measurement taken with the channel 180 while the error mode of the light source 110 was active would be free of oscillations entirely and thus the error mode would be easily identified. For example, FIG. 7 is an illustration of a scan of a sample with the detector 150 in the optical metrology device 100 with a light source 110 that is malfunctioning. As can be seen in FIG. 7, the light source 110 fails to produce wavelengths within a large range 702. A scan of the light source 110 while in such an error mode using the optical flat 182 and detector 184 in the channel 180 will have no oscillations in the wavelength range 702 and the error mode may therefore be easily identified. Moreover, much smaller error modes, e.g., smaller wavelength ranges with no light or shifts in wavelengths, may be easily detected using the optical flat 182 and detector 184 in the channel 180.

Figure 8:
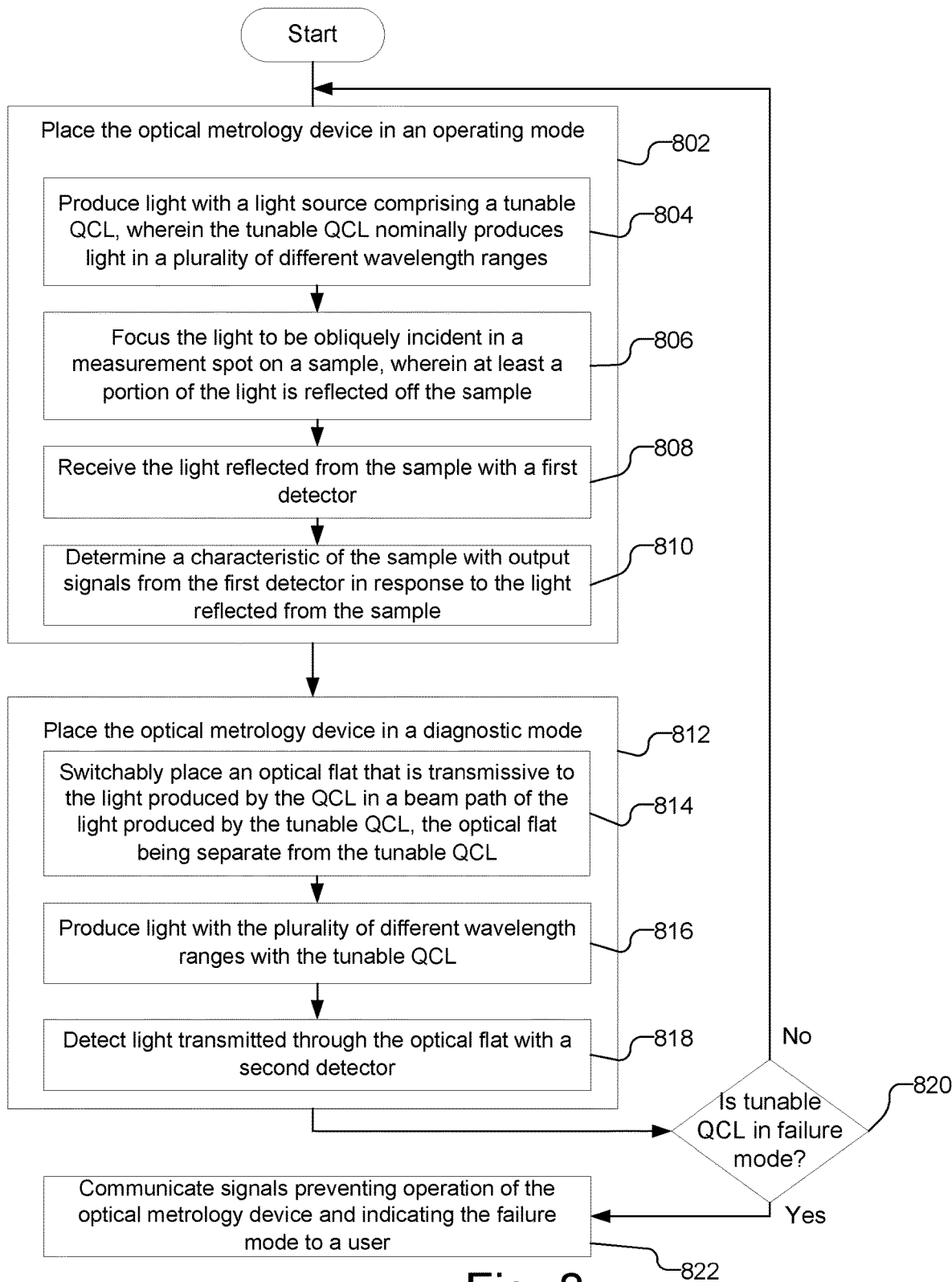
FIG. 8 is a flow chart illustrating a method of detecting failure of a light source in an optical metrology device.

FIG. 8 is a flow chart illustrating a method of detecting failure of a light source in an optical metrology device, such as optical metrology device 100, which may be, e.g., a reflectometer, ellipsometer, or Muller matrix ellipsometric, as discussed herein. As illustrated, the optical metrology device is placed in an operating mode (802). Operating mode includes producing light with a light source comprising a tunable Quantum Cascade Laser (QCL), wherein the tunable Quantum Cascade Laser nominally produces light in a plurality of different wavelength ranges (804). For example, as discussed above, the tunable QCL may include a number of external cavity quantum cascade lasers (ECQ-CLs), each producing a different range of wavelengths of light. For example, wavelength ranges between 2.5 µm and 30 µm, or more particularly between 5 µm and 13 µm may be produced. The light is focused to be obliquely incident in a measurement spot on a sample, wherein at least a portion of the light is reflected off the sample (806). The light reflected from the sample is received with a first detector (808). For example, as illustrated in FIGS. 1 and 2, the light may be received by detector 150, which may be a single pixel photodetector. A characteristic of the sample is determined with output signals from the first detector in response to the light reflected from the sample (810).

The optical metrology device is placed in a diagnostic mode (812). The diagnostic mode includes switchably placing an optical flat that is transmissive to the light produced by the QCL in a beam path of the light produced by the tunable QCL, the optical flat being separate from the tunable QCL (814). For example, as illustrated in FIGS. 1 and 2, the diagnostic mode includes directing the light 112 to the additional measurement channel 180 that includes the optical flat 182, e.g., using a moving mirror, such as flip mirror 186, or a beam splitter. The mirror reflects (or the beam splitter directs) at least a portion of the light produced by the tunable QCL to the optical flat. The mirror, for example, may be moved into the beam path at a location that is before the sample, i.e., between the tunable QCL and the sample. The optical flat, for example, may be a double side polished wafer, such as a silicon wafer. The optical flat may be a Fabry Perot Etalon. As illustrated in FIG. 3, the optical flat may be one of a plurality of optical flats that are transmissive to the light produced by the QCL, where a different optical flat is switchably placed in the beam path of the light produced by the tunable QCL for different wavelength ranges. Light with the plurality of different wavelength ranges is produced with the tunable QCL (816). Light transmitted through the optical flat is detected with a second detector (818). The second detector, for example, may be a separate detector from the first detector, such as detector 184 illustrated in FIGS. 1 and 2, and may be single pixel photodetector, as discussed above.

Whether the tunable QCL is in a failure mode is determined with output signals from the second detector (820), wherein while in failure mode the tunable Quantum Cascade Laser is not producing all wavelengths in the plurality of different wavelength ranges. For example, a measurement curve may be generated using the output signals from the second detector and compared to a calibration curve generated using an initial set of output signals from the second detector to determine if tunable Quantum Cascade Laser is in the failure mode. If the differences between the measurement curve and the calibration curve, e.g., determined as the means square error (MSE) or other appropriate technique, exceed a predetermined maximum threshold, for example, the tunable Quantum Cascade Laser may be considered to be in failure mode. In another example, the data from the output signals from the second detector may be compared to calculated data, e.g., data being calculated for a model of the optical flat as discussed above or using other modeling techniques, to determine if the tunable Quantum Cascade Laser may be considered to be in failure mode. For example, a first difference between a first set of measured data and calculated data is determined, and a second difference between the data from the output signals from the second detector and the calculated data is determined, and if a variation, e.g., determined as the means square error (MSE) or other appropriate technique, between the first difference and the second difference is greater than a predetermined maximum threshold, the tunable Quantum Cascade Laser may be considered to be in failure mode.

As illustrated, if the tunable QCL is not in failure mode, the process continues by placing the optical metrology device in operating mode 802. On the other hand, if the tunable QCL is in failure mode, signals are communicated preventing operation of the optical metrology device and indicating the failure mode to a user when it is determined that the tunable QCL is in the failure mode (822). Thus, the signals may be communicated to the optical metrology device itself to cause the optical metrology device to shut down. The signals may be further communicated to surrounding tools and processing equipment, such as wafer transfer robots, so that no further wafers are loaded onto the optical metrology device, and wafers are re-routed to other optical metrology devices that are not in failure mode. Further, the signals may be communicated to an alarm system, such as lights, or other indicators, to inform the user that the tunable QCL is in the failure mode. Thus, the indication of a failure mode may be used to modify, alter, or inform further processing of a current sample or the processing of subsequently processed samples, e.g., in a feed forward or feedback process. In this regard, the results may be exported to other systems.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. An optical metrology device capable of detecting failure of a light source, the optical metrology device comprising:
   the light source comprising a tunable Quantum Cascade Laser, wherein the tunable Quantum Cascade Laser nominally produces light in a plurality of different wavelength ranges; and
   at least one processor configured to, while the optical metrology device is in diagnostic mode:
   determine whether the tunable Quantum Cascade Laser is in a failure mode, wherein while in the failure mode the tunable Quantum Cascade Laser is not producing all wavelengths in the plurality of different wavelength ranges; and
   communicate signals that prevent operation of the optical metrology device and indicate the failure mode when it is determined that the tunable Quantum Cascade Laser is in the failure mode.

2. The optical metrology device of claim 1, wherein the plurality of different wavelength ranges comprise wavelength ranges between 2.5 μm and 30 μm.

3. The optical metrology device of claim 1, further comprising:
   an optical flat that is transmissive to the light produced by the tunable Quantum Cascade Laser in a beam path of the light produced by the tunable Quantum Cascade Laser, wherein the optical flat comprises a Fabry Perot Etalon; and
   a detector that receives light tranmsitted through the optical flat;
   wherein the at least one processor is coupled to receive output signals from the detector, and wherein the at least one processor is configured to determine whether the tunable Quantum Cascade Laser is in the failure mode using the output signals from the detector.

4. The optical metrology device of claim 1, wherein the optical flat is one of a plurality of optical flats that are transmissive to the light produced by the tunable Quantum Cascade Laser, wherein different optical flats in the plurality of optical flats are switchably placed in the beam path of the light produced by the tunable Quantum Cascade Laser for different wavelength ranges.

5. The optical metrology device of claim 3, further comprising a mirror in the beam path of the light produced by the tunable Quantum Cascade Laser that reflects at least a portion of the light produced by the tunable Quantum Cascade Laser to the optical flat.

6. The optical metrology device of claim 5, wherein the mirror is in the beam path at a location that is before a sample.

7. A method of detecting failure of a light source in an optical metrology device, the method comprising:
   determining whether a tunable Quantum Cascade Laser that nominally produces light in a plurality of different wavelength ranges is in a failure mode, wherein while in the failure mode the tunable Quantum Cascade Laser is not producing all wavelengths in the plurality of different wavelength ranges; and
   communicating signals preventing operation of the optical metrology device and indicating the failure mode when it is determined that the tunable Quantum Cascade Laser is in the failure mode.

8. The method of claim 7, wherein the plurality of different wavelength ranges comprise wavelength ranges between 2.5 μm and 30 μm.

9. The method of claim 7, further comprising:
   producing light with the tunable Quantum Cascade Laser that is transmitted through an optical flat in a beam path of the light produced by the tunable Quantum Cascade Laser, wherein the optical flat comprises a Fabry Perot Etalon; and
   wherein determining whether the tunable Quantum Cascade Laser is in the failure mode uses detected light after being transmitted through the optical flat.

10. The method of claim 9, wherein the optical flat is one of a plurality of optical flats that are transmissive to the light produced by the tunable Quantum Cascade Laser, the method further comprising switchably placing a different optical flat in the beam path of the light produced by the tunable Quantum Cascade Laser for different wavelength ranges.

11. The method of claim 9, further comprising placing the optical flat in the beam path of the light produced by the tunable Quantum Cascade Laser with a mirror into the beam path, wherein the mirror reflects at least a portion of the light produced by the tunable Quantum Cascade Laser to the optical flat.

12. The method of claim 11, wherein the mirror is in the beam path at a location that is before a sample.

13. The method of claim 9, wherein the determining whether the tunable Quantum Cascade Laser is in the failure mode comprises:
generating measurement data using output signals from a detector that detects the light after being transmitted through the optical flat;
comparing the measurement data to calibration data generated using an initial set of output signals from the detector to determine if the tunable Quantum Cascade Laser is in the failure mode.

14. The method of claim 13, wherein the measurement data comprises a measurement curve and the calibration data comprises a calibration curve generated using the initial set of output signals from the detector, and wherein comparing the measurement data to the calibration data from the detector to determine if the tunable Quantum Cascade Laser is in the failure mode comprises determining if a variation between the measurement curve and the calibration curve exceeds a predetermined maximum threshold.

15. The method of claim 13, wherein the calibration data comprises a first difference between an initial set of measured data and calculated data, the calculated data being calculated for a model of the optical flat, and the measurement data comprises a second difference between data from the output signals from the detector and the calculated data, and wherein comparing the measurement data to the calibration data from the detector to determine if the tunable Quantum Cascade Laser is in the failure mode comprises determining if a variation between the first difference and the second difference exceeds a predetermined maximum threshold.

16. An optical metrology device capable of detecting failure of a light source, the optical metrology device comprising:
means for determining whether a tunable Quantum Cascade Laser that nominally produces light in a plurality of different wavelength ranges is in a failure mode, wherein while in the failure mode the tunable Quantum Cascade Laser is not producing all wavelengths in the plurality of different wavelength ranges; and
means for communicating signals that prevent operation of the optical metrology device and indicate the failure mode when it is determined that the tunable Quantum Cascade Laser is in the failure mode.

17. The optical metrology device of claim 16, wherein the plurality of different wavelength ranges comprise wavelength ranges between 2.5 µm and 30 µm.

18. The optical metrology device of claim 16, wherein the means for determining whether the tunable Quantum Cascade Laser is in the failure mode uses a means for generating self-interference at different wavelengths in the light produced by the tunable Quantum Cascade Laser.

19. The optical metrology device of claim 18, wherein the means for generating self-interference at different wavelengths comprises individual optical flats that are switchably placed in a beam path of the light produced by the tunable Quantum Cascade Laser.

20. The optical metrology device of claim 18, further comprising a means for directing at least a portion of the light produced by the tunable Quantum Cascade Laser to the means for generating self-interference at different wavelengths.

21. The optical metrology device of claim 20, wherein the means for directing at least the portion of the light is positioned in a beam path at a location that is before a sample.

* * * * *